(12) United States Patent
Elia

(10) Patent No.: US 8,718,581 B2
(45) Date of Patent: *May 6, 2014

(54) METHOD AND APPARATUS FOR OPTIMIZING CURRENT CONSUMPTION OF AMPLIFIERS WITH POWER CONTROL

(75) Inventor: Avner Elia, Ramat Ishai (IL)

(73) Assignee: QUALCOMM Incorporated, San Diego, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 13/361,865

(22) Filed: Jan. 30, 2012

(65) Prior Publication Data

US 2012/0129473 A1     May 24, 2012

Related U.S. Application Data

(63) Continuation of application No. 12/094,639, filed as application No. PCT/IL2006/001372 on Nov. 28, 2006, now Pat. No. 8,107,902.

(60) Provisional application No. 60/741,550, filed on Nov. 28, 2005.

(51) Int. Cl.
*H04B 1/04* (2006.01)
*H01Q 11/12* (2006.01)
*H03F 1/02* (2006.01)
*H03F 1/56* (2006.01)
*H03F 3/191* (2006.01)

(52) U.S. Cl.
CPC .............. *H03F 1/0205* (2013.01); *H03F 1/56* (2013.01); *H03F 3/191* (2013.01); *H03F 2200/387* (2013.01); *H03F 2200/391* (2013.01)
USPC ........ 455/127.1; 455/121; 455/125; 455/126; 455/115.1

(58) Field of Classification Search
CPC .. H03F 1/0205; H03F 3/191; H03F 2200/387
USPC .............. 455/121, 122, 123, 125, 126, 127.2, 455/127.3, 127.4
See application file for complete search history.

(56) References Cited

U.S. PATENT DOCUMENTS 2,210,028 A    8/1940   Doherty
4,873,480 A * 10/1989   Lafferty ........................ 323/299

(Continued)

FOREIGN PATENT DOCUMENTS

GB          2356093 A     5/2001
WO        2007010543      1/2007

OTHER PUBLICATIONS

Cripps S.C., "RF Power Amplifiers for Wireless Communications", Artech House, 1999 (Parts 1 and 2 as filed).

(Continued)

*Primary Examiner* — Duc M Nguyen
(74) *Attorney, Agent, or Firm* — Ramin Mobarhan

(57) ABSTRACT

Apparatus and method for reducing the current consumption and increasing the efficiency of an RF power amplifier (PA), according to which the load, connected to the output stage of the PA, tuned dynamically or statically for each level of the desired output power. By doing so, the output impedance of the output stage is essentially matched, such that the dynamic RF load line has a slope that corresponds to the impedance required to provide this level. Whenever a smaller output power is desired in response to reduction in the input signal to the amplifier, the load is further tuned, such that the dynamic or static RF load line has a slope that causes the power amplifier to essentially remain in saturation at the smaller output power.

14 Claims, 3 Drawing Sheets

(56) References Cited

U.S. PATENT DOCUMENTS

| | | | | |
|---|---|---|---|---|
| 5,060,294 | A | * | 10/1991 | Schwent et al. ............... 455/93 |
| 5,276,912 | A | * | 1/1994 | Siwiak et al. ................. 455/73 |
| 6,020,787 | A | * | 2/2000 | Kim et al. ..................... 330/279 |
| 6,069,525 | A | | 5/2000 | Sevic et al. |
| 6,160,449 | A | | 12/2000 | Klomsdorf et al. |
| 6,349,216 | B1 | * | 2/2002 | Alberth et al. ............ 455/550.1 |
| 6,437,641 | B1 | | 8/2002 | Bar-David |
| 6,438,360 | B1 | * | 8/2002 | Alberth et al. ............... 455/110 |
| 6,522,201 | B1 | | 2/2003 | Hsiao et al. |
| 6,806,767 | B2 | | 10/2004 | Dow |
| 6,819,941 | B2 | * | 11/2004 | Dening et al. ............ 455/552.1 |
| 6,993,299 | B2 | | 1/2006 | Sugar et al. |
| 7,151,411 | B2 | * | 12/2006 | Martin et al. ................. 330/305 |
| 7,196,584 | B2 | | 3/2007 | Harris |
| 7,330,071 | B1 | | 2/2008 | Dening et al. |
| 7,427,897 | B2 | | 9/2008 | Hau et al. |
| 7,440,733 | B2 | | 10/2008 | Maslennikov et al. |
| 7,868,700 | B2 | * | 1/2011 | Elia ............................... 330/305 |
| 7,873,333 | B2 | * | 1/2011 | Tanaka et al. ................. 455/126 |
| 7,899,417 | B2 | * | 3/2011 | Elia ............................... 455/125 |
| 7,937,049 | B2 | | 5/2011 | Phillips et al. |
| 8,107,902 | B2 | * | 1/2012 | Elia ............................ 455/127.1 |
| 2004/0222847 | A1 | * | 11/2004 | Khanifar et al. ............... 330/51 |

OTHER PUBLICATIONS

Duvanaud C., et al., "Optimization of trade-offs between efficiency and intermodulation in SSPAs based on experimental and theoretical considerations" Microwave Symposium Digest,1993, IEEE MTT-S International Atlanta, Jun. 14-18, 1993, NY, IEEE, US, Jun. 14, 1993, pp. 285-288, XP010068217.

Gil-Garcia A., "Output Power-Control loop design for GSM Mobile phones" Agilent technologies Inc. Semiconductor Products Group, Santa Clara, CA, U.S.A., Oct. 2003. pp. 1-8.

International Search Report and Written Opinion—PCT/IL2006/001372—ISA/EPO—Mar. 3, 2013.

Neo W.C.E., et al., "Improved hybrid sige HBT class-ab power amplifier efficiency using varactor-based tunable matching networks" Bipolar/Bicmos Circuits and Technology Meeting, 2005. Proceedings of the Santa Barbara, CA, USA, Oct. 9-11, 2005, IEEE, pp. 108-111, XP010861844.

Office Action, Patent Office of Great Britain, counterpart application serial No. GB0810632.0, dated Jun. 29, 2010.

Pedro J.C., et al., "Design techniques for highly efficient class-F amplifiers driven by low voltage supplies" Electronics, Circuits and Systems, 1998 IEEE International Conference on Lisboa, Portugal Sep. 7-10, 1998, USA, IEEE, vol. 3, Sep. 7, 1998, pp. 201-204, XP010366013.

* cited by examiner

METHOD AND APPARATUS FOR OPTIMIZING CURRENT CONSUMPTION OF AMPLIFIERS WITH POWER CONTROL

CLAIM OF PRIORITY UNDER 35 U.S.C. §120

The present application for patent is a continuation of patent application Ser. No. 12/094,639 entitled "METHOD AND APPARATUS FOR OPTIMIZING CURRENT CONSUMPTION OF AMPLIFIERS WITH POWER CONTROL" filed May 22, 2008, allowed, which claims priority to International Patent Application No. PCT/IL2006/001372, filed Nov. 28, 2006, which claims priority to Provisional Application No. 60/741,550, filed Nov. 28, 2005, and assigned to the assignee hereof and hereby expressly incorporated by reference herein.

FIELD OF THE INVENTION

The present invention relates to the field of high efficiency power amplifiers. More particularly, the invention relates to a matching technique for reducing current consumption of RF power amplifiers when no change in output power is required.

BACKGROUND OF THE INVENTION

RF amplifiers normally achieve their maximum efficiency while being at saturation level. In many wireless applications, controlling output power as a function of receiving level is required. Withdrawal from saturation level will reduce efficiency. According to conventional solutions, the power stage is designed to handle the highest expected power, leading to lower efficiency at lower output power levels due to high quiescent currents.

One of the conventional ways to eliminate this problem is to control the DC supply of the power amplifier as a function of the power level. This solution is described for example, in U.S. Pat. No. 6,437,641, which discloses circuitry for dynamically enhancing the operating voltage of an RF amplifier. The resulting input drive to the PA is increased, thereby pushing its output well into saturation and handles the signal clipping by instantaneously enhancing the power supply voltage. However, additional active circuitry is required for such enhancement.

The efficiency of non-linear power amplifiers (which do not operate under class A conditions) is usually reduced with output power reduction. In many cases, especially where increased linearity is not needed, this behavior might be avoided. Other conventional ways of controlling efficiency are: using variable power supplies or enhanced dynamic loading techniques, such as a Linear Nonlinear Component (LINC) amplifier (that amplifies a signal which has amplitude variations that are generated by two or more signals, which vary only in their relative phases. The vector sum of the two signals can represent any amplitude) or an amplifier that operates in Doherty configuration (described for example, in U.S. Pat. No. 2,210,028).

Still, the methods described above have not provided satisfactory solutions to the problem of improving the efficiency of power amplifiers operated under large peak-to-average ratio input signals.

It is an object of the present invention to provide a method for efficiently controlling the current consumption of the PA for each level of output transmitting power.

It is another object of the present invention to provide a method for efficiently controlling the impedance at the output of the RF path for increasing the RF large signal gain of the amplifier without increasing the current consumption of the PA.

It is another object of the present invention to provide circuitry for efficiently controlling the PA current consumption, gain and output power independently.

Other objects and advantages of the invention will become apparent as the description proceeds.

SUMMARY OF THE INVENTION

The present invention is directed to a method for reducing the current consumption and increasing the efficiency of an RF power amplifier (PA), according to which the load, connected to the output stage of the PA, tuned dynamically or statically for each level of the desired output power. By doing so, the output impedance of the output stage is essentially matched, such that the dynamic RF load line has a slope that corresponds to the impedance required to provide this level. Whenever a smaller output power is desired in response to reduction in the input signal to the amplifier, the load is further tuned, such that the dynamic or static RF load line has a slope that causes the power amplifier to essentially remain in saturation at the smaller output power.

Whenever the RF power amplifier is a part of a MIMO system that is required to provide a desired total output power level and consisting of a plurality of PAs, the efficiency of the MIMO system is increased by determining an individual output power level for each PA, which is a portion of the total output power level. The load, connected to the output stage of each PA is dynamically or statically tuned to essentially match the output impedance of its output stage, such that its dynamic or static RF load line has a slope that corresponds to the impedance required to provide the portion. Whenever a smaller output power is desired in response to reduction in the input signal to MIMO system, a reduced portion for each PA is determined. The load is further tuned, such that the dynamic RF load line has a slope that causes each PA to essentially remain in saturation while providing the reduced portion.

Preferably, the PA is operated under Class B, Class AB or Class C.

The present invention is directed to an apparatus for reducing the current consumption and increasing the efficiency of an RF power amplifier (PA), that comprises a matching circuitry for dynamically or statically tuning the load, connected to the output stage of the PA, to essentially match the output impedance of the output stage for each level of the desired output power, such that the dynamic RF load line has a slope that causes the power amplifier to essentially remain in saturation at the level.

The apparatus may be used for matching the output of an RF power amplifier that is a part of a MIMO system and that is operated under Class B, Class AB or Class C.

BRIEF DESCRIPTION OF THE DRAWINGS

The above and other characteristics and advantages of the invention will be better understood through the following illustrative and non-limitative detailed description of preferred embodiments thereof, with reference to the appended drawings, wherein.

DETAILED DESCRIPTION OF PREFERRED EMBODIMENTS

The present invention provides a method and apparatus for achieving the same efficiency for various values of output power by using different variable loading technique and re-matching of power amplifiers in order to reduce their current consumption. An additional advantage obtained by using the method proposed by the present invention is achieving higher power gain with the same power amplifier transistors.

Additional applications of the proposed method are in wireless transmitters with power control and adaptable Multiple Input-Multiple Output (MIMO) arrays. Changing the load line in a wireless transmitter can be done once per amplifier or once per output power. The efficiency of a MIMO array can also be significantly improved using the proposed method by controlling each path independently.

The method proposed by the present invention allows reduction of current consumption of a power amplifier (PA). This method involves changing the matching circuit of the RF power amplifier, in order to reduce the current and enhance the power gain of the amplifier on the expense of amplifier output power saturation point.

Two kinds of RF matching techniques are commonly used for power amplifiers. Maximal Power Gain is achieved while using conjugate matching circuit. Higher output 1 dB compression, but lower power gain is achieved while using a power-matching circuit. In cases where the current and voltage limitations of the power transistors are dominant, power matching is usually used. In many situations, power matching yields 2 dB higher compression point, as described, for example, in Cripps, C. Steve, "RF Power Amplifiers for Wireless Communications", Artech House, 1999. This result is somewhat dependent on the transistor being matched.

Figure 1:
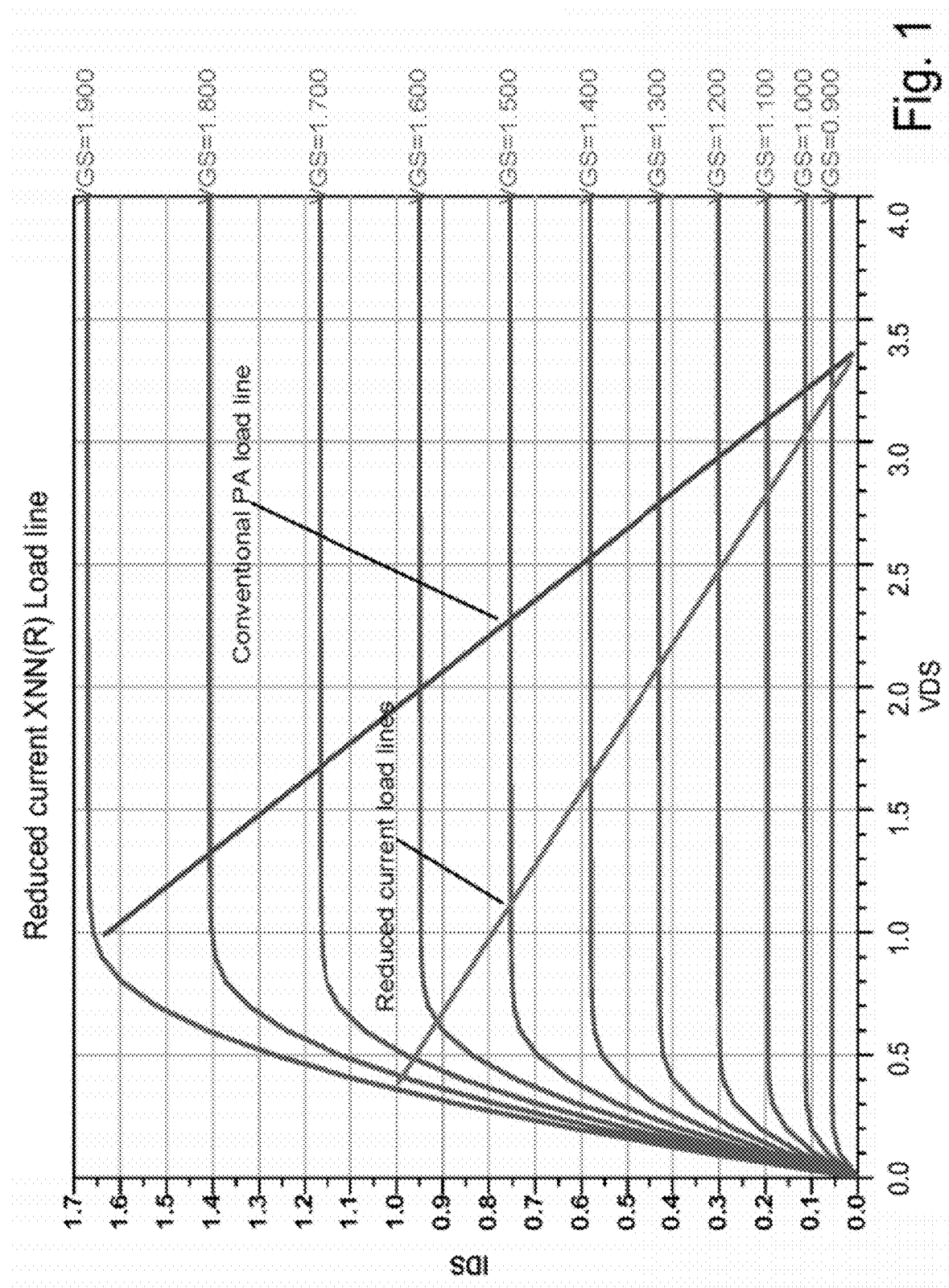
FIG. 1 schematically illustrates tuned load lines, according to a preferred embodiment of the invention.

FIG. 1 schematically illustrates tuned load lines, according to a preferred embodiment of the invention. Load line A is for a conventional class B Power amplifier. When operating with this load line, reducing output power can be achieved by reducing the input power. However, the current consumption will only be slightly reduced, and the efficiency is degraded. In contradiction, load line B is obtained, according to the invention, after tuning the amplifier for lower output power. It can be noticed that the length of load line B is shorter than the length of load line A. This is the reason for the lower power handling capability of the amplifier. The graph of FIG. 1 also clearly shows how reduced current mode is achieved. The efficiency in this case is not degraded. The method proposed herein allows adaptively changing the load line, while matching the optimal load line for each output power level.

High efficiency amplifier classes of operation with reduced conduction angle such as class AB, Class B and Class C configurations are very widely used. Extensive analysis of the expected efficiency of these modes can be found for example in Cripps, as well. Although the analysis below is an implementation of the proposed method for class B, similar implementations for any other conducting angle and power enhancement can used with the method proposed by the present invention.

EXAMPLES

Example 1

Adaptive Load Line Changing for Power Controlled System

Figure 2:
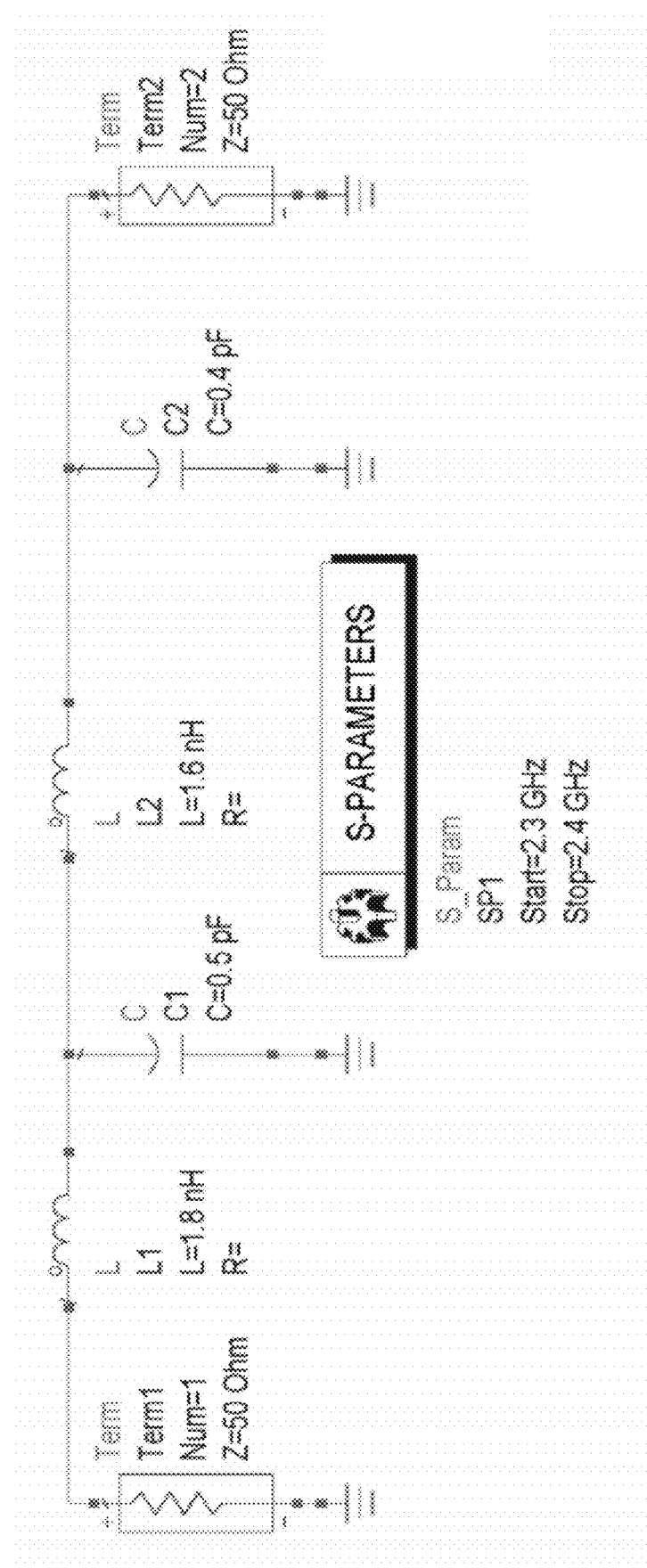
FIG. 2 illustrates a 50Ω to 75Ω matching circuit.
Figure 3:
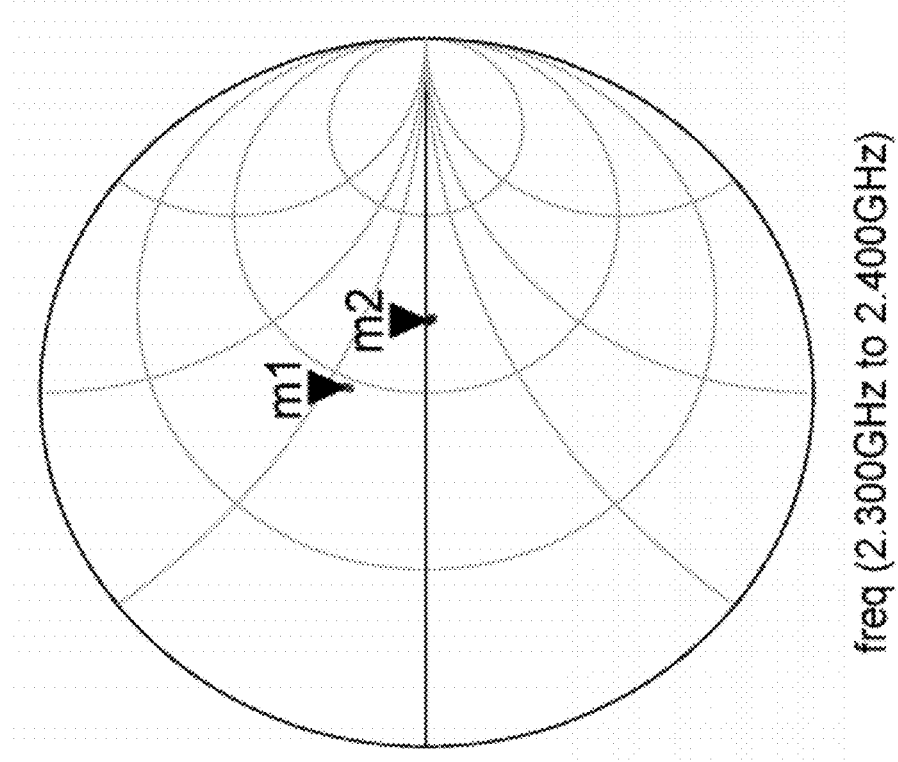
FIG. 3 illustrates the simulation results on a Smith Chart, for a 75Ω load impedance.

Most of the advanced power amplifiers have internal pre-matching and no external matching is required while using a 50Ω load. For this example, it is assumed that the amplifier used is pre-matched to a 50Ω load. Increasing the output load line impedance can be done using classical matching techniques. FIG. 2 hereinbelow is an example for such matching circuit and FIG. 3 hereinbelow is its simulation results for 75Ω load impedance.

The load line curve can be adaptively changed by simply tuning the parallel capacitors shown in the matching circuit FIG. 2. Load lines in the range of 50-85Ω have been tested.

As an example, a design of a power controlled power amplifier for a Global System for Mobile Communications (GSM) mobile phone working according to the 3GPP GSM standard TS 45.005 is illustrated. Control of nominal output power is done in 2 dB steps. The maximum output power levels for handset mobile stations class 4 GSM is +33 dBm (for 850/900 MHz band) and for class 1 Digital Cellular Service (DCS) and Personal Communications Service (PCS) is +30 dBm. The dynamic range for power control is 28 dB for the 850/950 MHz band and 30 dB for the 1800/1900 MHz band (see for example, "Output Control loop design for GSM Mobile phone" by Alex Gil-Garcia, Agilent technologies Inc. Santa Clara, Calif., U.S.A.). The required mobile output signal strength is determined by the distance between the mobile device and the base station and, by environmental conditions. 2 dB front end and mismatch losses are expected, leading to a higher PA output power level. The power amplifier efficiency for such an amplifier may be as high as 57% at the maximum output level (such as PA RF3146, which is a Power Amp Module manufactured by RFMD Greensboro, N.C., U.S.A.), but reduced to 2% at the lower power level. This situation can be eliminated using the method proposed by the present invention. This is done by dynamically changing the load line, keeping the highest efficiency for the first four steps, and keeping this load line for the rest of the power levels. The efficiency at lower power level is also increased and we will get 5% for the lowest power level. This might reduce the current consumption and increase the batteries lifetime by a factor of two.

Such implementation of dynamically changing the output load can be implemented in various applications including: cellular phones from all systems and frequencies, WiMax applications, WiFi applications, and all applications where output power needs to be changed dynamically.

Example 2

Adaptable MIMO Arrays

For a specific MIMO system with up to four amplifier paths, the total power has been designed to stay constant for all operational modes. That means that for the case where only one amplifier operates, it should work at maximum power. If more paths are operating, the power of each of them is reduced by a factor of the number of paths. For optimal operation, the first amplifier was designed to work at maximal power level, with adaptive load line control, similar to the previous example. The others were designed to work with lower power level. The system efficiency remains high for all system modes.

For a MIMO W-LAN system working according to the IEEE standard 802.11n with up to four transmit paths, the total output power is limited to 100 mW (20 dBm), due to the to total output power limitations for systems operating in the un-licensed frequency bands. If for example, we have four Power Amplifiers (PAs) that comply with the standard mask requirements at maximum output power of 20 dBm for each PA and with efficiency of 20% per PA at that output power, when the system is operated in the mode where only one PA is active, the load line of that PA is tuned such that the output power is 20 dBm according to the standard's limitations and the current consumption yields an efficiency of 20%.

When the system is operated in a mode where two PAs are active simultaneously, the load line of each PA is changed, such that the output power of each PA is tuned to 17 dBm, thereby producing a total output power of 20 dBm from the system. When the system is operated in a mode where three PAs are active simultaneously, the load line of each PA is changed such that the output power of each PA is tuned to 15 dBm, thereby producing a total output power of 20 dBm from the system. When the system is operated in a mode where the four PAs are active simultaneously, the load line of each PA is changed such that the output power of each PA is tuned to 14 dBm, thereby producing a total output power of 20 dBm from the system. The change in Load line of each PA allows keeping the total system efficiency at 20% for all cases. Practically small degradation is expected due to quiescent current of the PAs, which cannot be reduced linearly with load line changes. This way, the current drawn by the power amplifier while operating at various output power levels is reduced, while maintaining a better RF power gain, compared to the compatible class of operation.

The above examples and description have of course been provided only for the purpose of illustration, and are not intended to limit the invention in any way. As will be appreciated by the skilled person, the invention can be carried out in a great variety of ways, employing more than one technique from those described above, all without exceeding the scope of the invention.

The invention claimed is:

1. A method, comprising:
   tuning a load connected to an output stage of a power amplifier to impedance match an output impedance of the output stage, the tuning based on maintaining a slope of an RF load line of the power amplifier to correspond to an impedance providing a higher desired output power level while the power amplifier operates in saturation for a plurality of higher output power steps and changing the slope of the RF load line of the power amplifier to correspond to an impedance providing a lower desired output power level to maintain the power amplifier in saturation for a plurality of lower output power steps; and
   adjusting a level of power enhancement to the power amplifier to match the tuned load at the higher and lower desired output power levels.

2. The method of claim 1, further comprising whenever a lower output power level is desired in response to reduction in an input signal to the power amplifier, further tuning the load, such that the RF load line has a slope that causes the power amplifier to remain in saturation at the lower desired output power level.

3. The method of claim 2, further comprising further adjusting the level of enhancement to match the lower desired output power level.

4. The method of claim 1, wherein whenever the RF power amplifier is a part of a MIMO system that is required to provide a desired total output power level and consisting of a plurality of similar power amplifiers, the method further comprising increasing the efficiency of said MIMO system including for each power amplifier:
   determining an individual output power level as a portion of a total output power level; and
   statically tuning the load connected to an output stage of a power amplifier to impedance match an output impedance of the output stage, the tuning based on maintaining a slope of the RF load line of the power amplifier to correspond to an impedance providing the portion while the power amplifier operates in saturation.

5. The method of claim 4, further comprising:
   determining a reduced portion for each of the power amplifiers whenever a lower output power level is desired in response to reduction in the input signal to the MIMO system; and
   further tuning the load to maintain a slope of the RF load line of the power amplifiers to correspond to an impedance providing the reduced portion while the power amplifiers operate in saturation.

6. The method of claim 1, wherein the power amplifier operates in one of Class B, Class AB or Class C modes.

7. An apparatus, comprising:
   matching circuitry configured to tune a load connected to an output stage of a power amplifier to impedance match an output impedance of the output stage, the tuning based on maintaining a slope of an RF load line of the power amplifier to correspond to an impedance providing a higher desired output power level while the power amplifier operates in saturation for a plurality of higher output power steps and changing the slope of the RF load line of the power amplifier to correspond to an impedance providing a lower desired output power level to maintain the power amplifier in saturation for a plurality of lower output power steps; and
   circuitry configured to adjust a level of power enhancement to the power amplifier to match the tuned load at the higher and lower desired output power levels.

8. The apparatus of claim 7, wherein whenever a lower output power level is desired in response to reduction in an input signal to the power amplifier, the matching circuit further configured to tune the load, such that the RF load line has a slope that causes the power amplifier to remain in saturation at the lower desired output power level.

9. The apparatus of claim 8, wherein the circuitry is further configured to adjust the level of enhancement to match the lower desired output power level.

10. The apparatus of claim 7, wherein whenever the RF power amplifier is a part of a MIMO system that is required to provide a desired total output power level and consisting of a plurality of similar power amplifiers, the apparatus further configured to increase the efficiency of said MIMO system including for each power amplifier, the apparatus further configured to:
    determine an individual output power level as a portion of a total output power level; and
    statically tune the load connected to an output stage of a power amplifier to impedance match an output impedance of the output stage, the tuning based on maintaining a slope of the RF load line of the power amplifier to correspond to an impedance providing the portion while the power amplifier operates in saturation.

11. The apparatus of claim 7, wherein the apparatus is part of a MIMO system.

12. The apparatus of claim 7, wherein the power amplifier of the apparatus operates in one of Class B, Class AB or Class C modes.

13. A method, comprising:
    tuning a load line of a power amplifier that uses power enhancement to maintain a slope that corresponds to an impedance required to provide a desired total power from the power amplifier while in saturation for a plurality of higher output power steps and to change the slope to correspond to an impedance providing a higher desired output power level to maintain the power amplifier in saturation for a plurality of lower output power steps; and adjusting a level of the power enhancement to the power amplifier to match a tuned load at the higher desired output power level.

14. An apparatus, comprising:

matching circuitry configured to tune a load line of a power amplifier that uses power enhancement to maintain a slope that corresponds to an impedance required to provide a desired total power from the power amplifier while in saturation for a plurality of higher output power steps and to change the slope to correspond to an impedance providing a higher desired output power level to maintain the power amplifier in saturation for a plurality of lower output power steps; and circuitry configured to adjust a level of the power enhancement to the power amplifier to match a tuned load at the higher desired output power level.

\* \* \* \* \*